United States Patent [19]
Cranford, Jr. et al.

[11] Patent Number: 5,872,446
[45] Date of Patent: Feb. 16, 1999

[54] LOW VOLTAGE CMOS ANALOG MULTIPLIER WITH EXTENDED INPUT DYNAMIC RANGE

[75] Inventors: Hayden Clavie Cranford, Jr.; Ronald Steven Gyurcsik, both of Apex, N.C.; James Francis McElwee, Jr., Austin, Tex.

[73] Assignee: International Business Machines Corporation, Armonk, N.Y.

[21] Appl. No.: 910,165

[22] Filed: Aug. 12, 1997

[51] Int. Cl.⁶ .................................. G05F 3/16; H03F 3/04
[52] U.S. Cl. ................................. 323/315; 330/288
[58] Field of Search ...................... 323/312, 313, 323/315; 327/538, 539, 543; 330/257, 288

[56] References Cited

U.S. PATENT DOCUMENTS

| | | | |
|---|---|---|---|
| 4,546,275 | 10/1985 | Pena-Finol et al. | 307/498 |
| 5,115,409 | 5/1992 | Stepp | 364/841 |
| 5,182,477 | 1/1993 | Yamasaki et al. | 307/494 |
| 5,298,796 | 3/1994 | Tawel | 307/201 |
| 5,442,583 | 8/1995 | Kirk et al. | 364/841 |
| 5,523,717 | 6/1996 | Kimura | 330/252 |
| 5,570,056 | 10/1996 | Groe | 327/359 |
| 5,587,687 | 12/1996 | Adams | 330/253 |
| 5,635,863 | 6/1997 | Price, Jr. | 327/3 |

*Primary Examiner*—Matthew Nguyen
*Attorney, Agent, or Firm*—John D. Flynn

[57] ABSTRACT

A low voltage CMOS multiplier uses a transconductance stage to generate a dynamic bias current which is used to compensate for non-linear terms in a Gilbert Cell multiplier circuit. Common mode dependence is minimized by using balanced differential input stages for both the transconductance and multiplier stages.

5 Claims, 3 Drawing Sheets

LOW VOLTAGE CMOS ANALOG MULTIPLIER WITH EXTENDED INPUT DYNAMIC RANGE

FIELD OF THE INVENTION

The invention relates to analog signal multipliers and more specifically to a low voltage, four-quadrant CMOS analog multiplier with dynamic bias compensation to achieve accurate linear operation over a wide differential input voltage range and having a low sensitivity to common mode voltage at either input.

BACKGROUND

Analog multipliers are used in many different applications such as modulators, demodulators and mixers to name a few. In some applications it is necessary that the multiplier yield linear products of both inputs. Linear products of both inputs are easily achieved in the digital domain. However, the results can involve considerable cost over an analog implementation in the form of A/D and D/A converters and in general consume more power and chip area than an analog implementation.

The most critical design specification for a multiplier is linearity or distortion for a given dynamic voltage range, either input or output. If the input voltages are small, a simple MOS version of the well known Gilbert cell can be used with good results. If larger input ranges are contemplated, a compensation technique must be employed in order to improve linearity at the extremes of the range. Furthermore, low voltage supplies require additional techniques, such as folding, to make linear operation possible with standard CMOS devices. The use of a compensation signal without encountering increased common mode signal dependence and the use of many additional devices is difficult at best. In addition, operation using standard CMOS devices at low supply voltages (3.3 V) presents a unique challenge.

The publications listed below are considered relevant background material since alternative solutions or components include in the application.
1. Garverick, Sodini, "A Wide-Band NMOS Balanced Modulator/Amplifier Which Uses 1 um Transistors for Linearity," IEEE Journal of Solid-State Circuits, Vol. 23, No. 1, p. 195, February 1988.
2. Pena-Finol and Connely, "A MOS Four-Quadrant Analog Multiplier Using the Quarter-Square Technique," IEEE Journal of Solid State Circuits, Vol. SC-20, No. 6, p. 1158, December 1985.
3. Z. Wang, "A CMOS Four-Quadrant Analog Multiplier with Single-Ended Voltage Output and Improved Temperature Performance," IEEE Journal of Solid State Circuits, Vol. 26, No. 9, p. 1293, September 1991.
4. Babanezhad and Temes, "A 20V Four-Quadrant CMOS Analog Mulitplier," IEEE Journal of Solid-State Circuits, Vol. SC-20, No. 6, p. 1158, December 1985.
5. Wong, Kalyanasundaram, Salam, "Wide Dynamic Range Four-Quadrant CMOS Analog Multiplier Using Linearized Transconductance Stages," IEEE Journal Solid State Circuits, Vol. SC-21, No. 6, p. 1120, December 1986.
6. Nedungadi and Viswanathan, "Design of Linear CMOS Transconductance Elements," IEEE Transactions on Circuits Systems, Vol. CAS-31, p. 891, October, 1984.
7. B. Gilbert, "A Precise Four-Quadrant Multiplier with Subnanosecond Response," IEEE Journal Solid State Circuits, Vol. SC-3, No. 4, December, 1968.

(1) uses the linear transconductance properties of short channel devices to construct a multiplier. This solution is not acceptable due to the reliability problems associated with high fields and short channel devices.

(2) and (3) disclose a quarter-square technique which uses the square of the sum of the input signals minus the square of the difference of the input signals, to obtain a linearly scaled product of the two inputs.

(4) and (5) disclose a compensated Gilbert Cell discussed above.

(6) describes a transconductance stage, a component used in this invention.

(7) describes a simple MOS version of a Gilbert Cell, a component used in the invention and described above.

SUMMARY OF THE INVENTION

The invention contemplates a circuit for multiplying two signals represented by two analog voltages $V_x$ and $V_y$. A transconductance circuit responsive to $V_x$ converts $V_x$ to a related first current $I_{tran}$. Two n-channel cross coupled differential transistor pairs of a Gilbert Cell core multiplier responsive to $V_x$ provide a second currents $I_x$ and $I_y$ which are related to the value of $V_x$; a folded p-channel transistor pair responsive to $V_y$ provide a third currents $I_{y1}$ and $I_{y2}$ related to $V_y$; and, a current source under control of the first current combines the second and third currents whereby the voltage output of the Gibert Cell core is a linear representation of the product of $V_x$ and $V_y$.

DETAILED DESCRIPTION OF THE INVENTION

Figure 1:
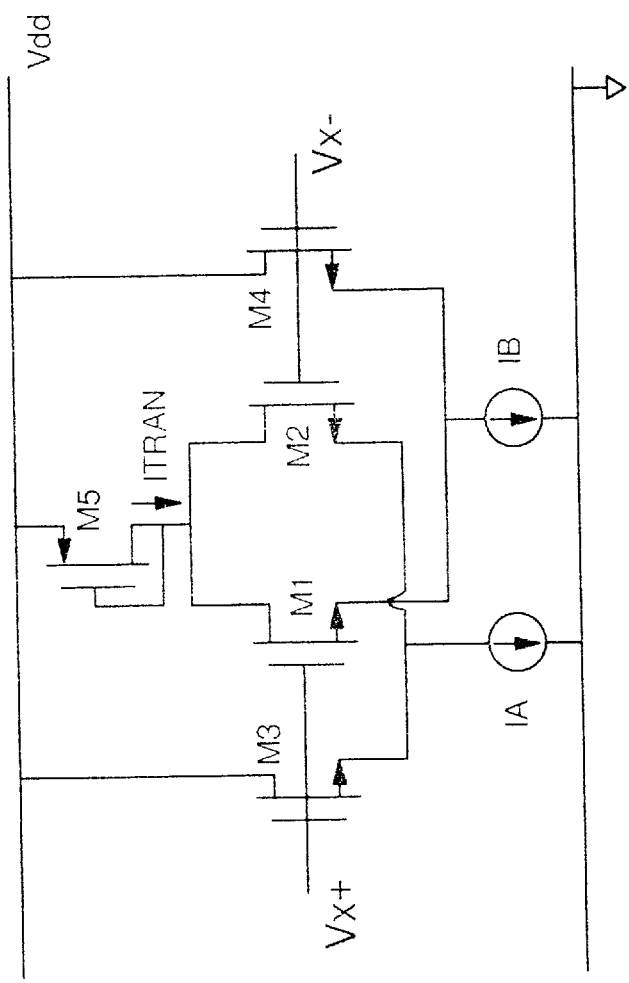
FIG. 1 is a schematic diagram of a transconductance circuit.
Figure 2:
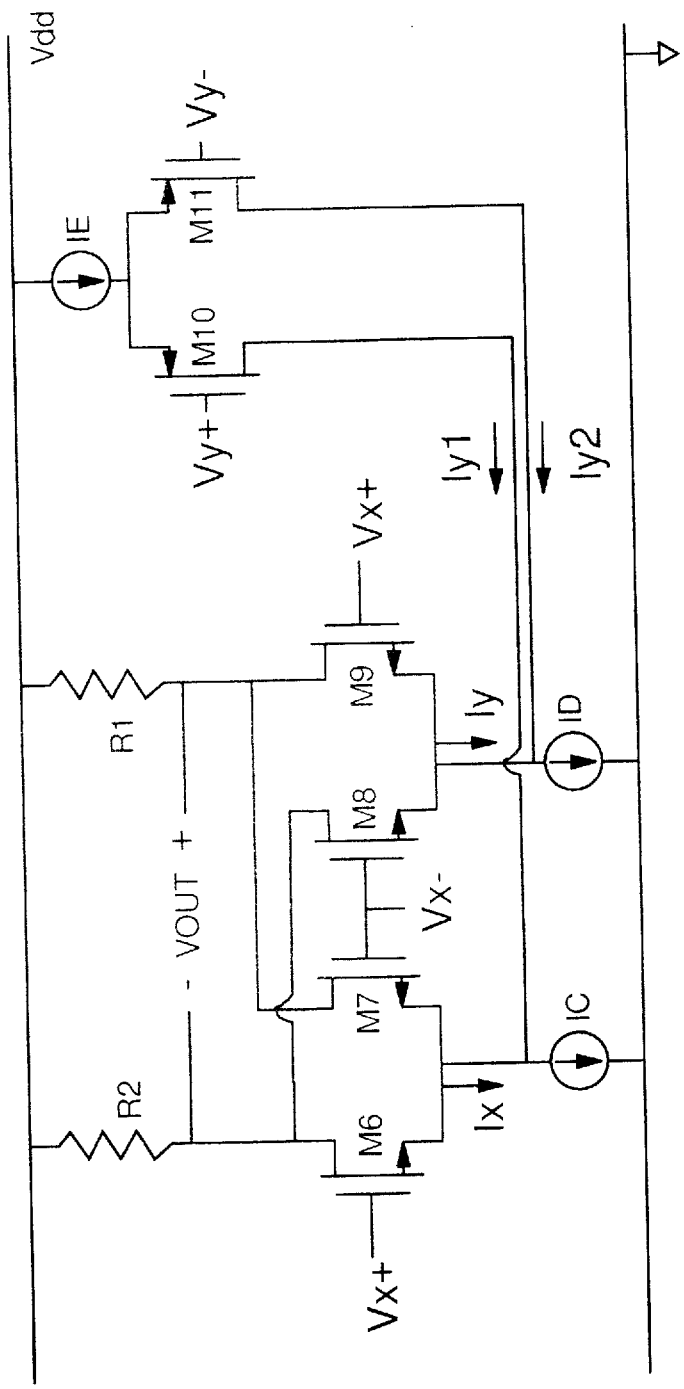
FIG. 2 is a schematic diagram of a Gilbert Cell Core.

The novel multiplier (FIG. 3) uses one transconductance circuit (FIG. 1) to generate a compensating bias voltage for a Gilbert Cell core (FIG. 2). An understanding of how the transconductance circuit and the Gilbert Cell core operate is useful in understanding how these two circuit elements can be used together to achieve a novel multiplier having the desired characteristics set forth above.

In FIG. 1 devices M3 and M4 have the same dimensions. Devices M1 and M2 also have the same dimensions, however, devices M3 and M4 are scaled by a size factor n relative to devices M1 and M2. Current sources IA and IB are both set to (n+1) I, where n is the scale factor described above. The input to the circuit ($V_{x+}$ and $V_{x-}$) is the same as the "x" input to the Gilbert Cell core which will be described later. The signal plus dc drain currents of M1 and M2 are summed ($I_{tran}$) in device M5.

Based on the (ideal) square-law behavior of the MOS transistor in saturation $$I_{DS} = \frac{\mu C_0}{2} \cdot \left(\frac{W}{L}\right)(V_{GS} - V_T)^2 = K(V_{GS} - V_T)^2 \quad (1)$$

The equation for $I_{tran}$, can be written as a function of the differential input voltage $V_x$. All devices are biased to operate in the saturation region. The resulting expression is given in terms of the scale factor n, the dc current I, the circuit transconductance coefficient $K_{tran}$ and the differential input voltage $V_x$. The current $I_{tran}$ is used to bias the Gilbert Cell core multiplier.

$$I_{tran} = 2I + 2K_{tran}\left[\frac{n(n-1)}{(n+1)^2}\right]V_x^2 \quad (2)$$

I is a fixed DC current and is equal to IA/IB divided by n+1 where n is the scale factor described above.

A conventional Gillbert Cell core used as a multiplier ($V_x*V_y$) is illustrated in FIG. 2. In the prior art, current sources IC and ID can be either fixed or compensated to overcome the non-linearities discussed above. In the discussion which follows it will be assumed that the $I_{tran}$ current (a function of $V_x$) developed in the transconductance circuit of FIG. 1 is used in lieu of conventional current sources IC and ID. $I_{tran}$ is applied via a current mirror illustrated in FIG. 3 (see devices M12–M15) to compensate for the operating conditions described above which in the absence of compensation would introduce non-linearties.

The Gilbert Cell multiplier illustrated in FIG. 2 has two cross-coupled n-channel differential pairs M6–M9 (matched transistors), equal resistive loads R1 and R2 and a folded p-channel pair M10 and M11. The four n-channel transistors are of equal dimensions and the two p-channel transistors are of equal dimensions. In the analysis it will be assumed that current sources IC and ID are equal and are generated from the $I_{tran}$ output of the transconductance circuit illustrated in FIG. 1.

The output ($V_{out}$) from the cross coupled pairs (M6–M9) is $$V_{out} = K_n \cdot R \cdot V_x \left(\sqrt{\frac{2I_y}{K_n} - V_x^2} - \sqrt{\frac{2I_x}{K_n} - V_x^2}\right) \quad (3)$$

where $I_x$ and $I_y$ are illustrated in FIG. 2 and $K_n$ is the device transconductance coefficient of transistors M6–M9. When all of the devices are in saturation, current sources $I_x$ and $I_y$ can be expressed as a function of $I_{tran}$ and the current $I_{y1}$ and $I_{y2}$ from the folded p=channel transistors M10 and M11, respectively.

$$I_x = I_{tran} - I_{y1}$$

$$I_y = I_{tran} - I_{y2} \quad (4)$$

By substitution, equation 3 can be re-written $$V_{out} = \quad (5)$$

$$K_n \cdot R \cdot V_x \left(\sqrt{\frac{2I_{tran}}{K_n} - V_x^2 - \frac{2I_{y2}}{K_n}} - \sqrt{\frac{2I_{tran}}{K_n} - V_x^2 - \frac{2I_{y1}}{K_n}}\right)$$

The terms under the radical include $V_x$ squared as does $I_{tran}$, therefore the term can be eliminated. By expanding the current $I_{tran}$ in terms of n and $V_{x1}$ the dependence on $V_x$ for the term under the radical can be eliminated with the proper value for n. For $V_x$ squared terms to be eliminated:

$$\frac{2}{K_n}\left\{2K_{tran}\left[\frac{n(n-1)}{(n+1)^2}\right]\right\}V_x^2 = V_x^2 \quad (6)$$

By setting $K_{tran}$ (the transconductance circuit device transconductance coefficient) equal to $K_n$ (Gilbert Cell device transconductance coefficient) and selecting n as $$n = 1 + \frac{2}{\sqrt{3}} \quad (7)$$

the expression for $V_{out}$ reduces to:

$$V_{out} = \sqrt{2K_n} \cdot R \cdot V_x (\sqrt{2I - I_{y2}} - \sqrt{2I - I_{y1}}) \quad (8)$$

R refers to the value in ohms of the Gilbert Cell load resistors R1 and R2. For IE=2I, where IE is the dc bias tail current for the p-channel "Y" input pair:

$$V_{out} = \sqrt{2K_n} \cdot R \cdot V_x(\sqrt{2I - (IE - I_{y1})} - \sqrt{2I - (IE - I_{y2})}) \quad (9)$$

$$= \sqrt{2K_n} \cdot R \cdot V_x(\sqrt{I_{y1}} - \sqrt{I_{y2}})$$

this can by written in terms of $V_y$:

$$V_{out} = \sqrt{2K_n} \cdot R \cdot V_x(\sqrt{K_p} \cdot V_y) = \boxed{\sqrt{2K_n K_p} \cdot R \cdot V_x \cdot V_y} \quad (10)$$

equation 10 represents an ideal multiplication operation and is valid as long as the devices remain in saturation.

Figure 3:
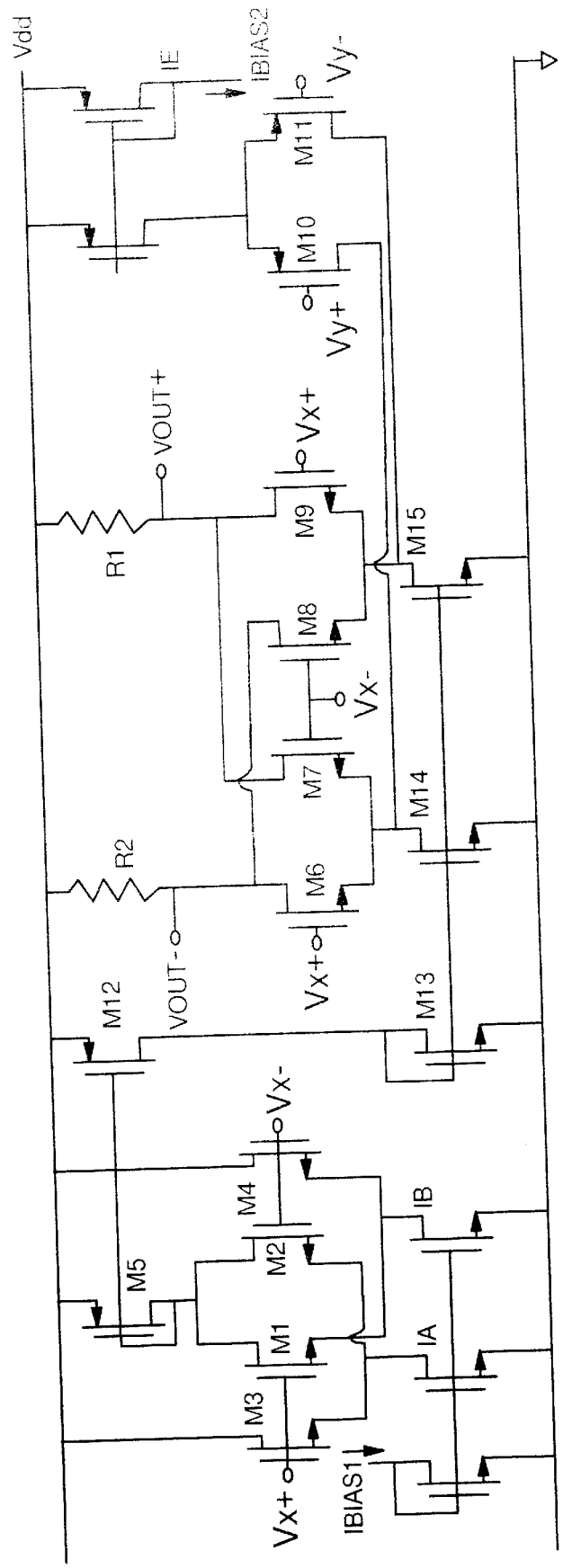
FIG. 3 is a schematic diagram of a novel analog multiplier circuit constructed according to the invention.

FIG. 3 is a schematic of a complete multiplier. The references employed in FIG. 3 are the same as those used in FIGS. 1 and 2 in those cases where the element performs the same function in the circuit illustrated in FIG. 3. $V_x$ and $V_y$ are applied as illustrated in FIG. 3 to devices M6–M9 and M10–M11, respectively of the Gibert Cell core. $V_x$ is applied to devices M1–M4 of the transconductance circuit which converts $V_x$ to related current ($I_{tran}$). This current mirrored by transistors M12 and M13 to current sources M14 and M15 which replace current sources IC and ID illustrated in FIG. 2.

We claim:

1. A circuit for multiplying two signals represented by two analog voltages $V_x$ and $V_y$ comprising:
    a transconductance circuit responsive to $V_x$ for converting $V_x$ to a related first current ($I_{tran}$); and,
    a Gilbert Cell core multiplier having two n-channel cross coupled differential transistor pairs responsive to said voltage $V_x$ and providing a second current ($I_x$, $I_y$) related to the value of $V_x$, a folded p-channel transistor pair responsive to the voltage $V_y$ and providing a third current ($I_{y1}$, $I_{y2}$) related to the voltage $V_y$, and a current source (M14,M15) under control of said first current for combining said second and third currents whereby the voltage output ($V_{out}$) of the said Gibert Cell core is a linear representation of the product of $V_x$ and $V_y$.

2. The multiplier set forth in claim 1 in which the signal voltage $V_x$ is a differential voltage ($V_{x+}$ and $V_{x-}$) and the transconductance circuit responsive to the differential voltage includes:
    a first pair of transistors (M3 and M4) each responsive to a different phase of the differential signal voltage;
    a second pair of transistors (M1 and M2) each responsive to a different phase of the differential signal voltage;
    said first pair being scaled by a size factor n relative to the second pair; and,
    circuit means including a current source for connecting the two pairs between a bias voltage and ground.

3. The multiplier circuit set forth in claim 2 in which the transconductance coefficients of the transistors in the transconductance circuit are set equal to a predetermined ratio of the transconductance coefficients of the transistors in the Gilbert Cell.

4. The multiplier circuit set forth in claim 3 in which the predetermined ratio is one.

5. The multiplier set forth in claim 4 in which the scale factor n is set equal to 1+2/√3.

* * * * *